US012578507B2

(12) United States Patent
Hirose et al.

(10) Patent No.: US 12,578,507 B2
(45) Date of Patent: Mar. 17, 2026

(54) ANTIGLARE FILM

(71) Applicant: DAICEL CORPORATION, Osaka (JP)

(72) Inventors: Kensaku Hirose, Tokyo (JP); Masaki Hayashi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 280 days.

(21) Appl. No.: 18/288,123

(22) PCT Filed: Dec. 17, 2021

(86) PCT No.: PCT/JP2021/046772
§ 371 (c)(1),
(2) Date: Oct. 24, 2023

(87) PCT Pub. No.: WO2022/269949
PCT Pub. Date: Dec. 29, 2022

(65) Prior Publication Data
US 2024/0210597 A1 Jun. 27, 2024

(30) Foreign Application Priority Data
Jun. 22, 2021 (JP) ................................. 2021-103450

(51) Int. Cl.
*G02B 1/111* (2015.01)
*G02B 1/14* (2015.01)
*H10K 59/80* (2023.01)

(52) U.S. Cl.
CPC ................ *G02B 1/111* (2013.01); *G02B 1/14* (2015.01); *H10K 59/8792* (2023.02)

(58) Field of Classification Search
CPC ........... G02B 1/111; G02B 1/14; G02B 1/115; G02B 5/02; G02B 5/0242; H10K 59/8792; H10K 50/00; B32B 7/023; H05B 33/02
See application file for complete search history.

(56) References Cited

U.S. PATENT DOCUMENTS

2002/0012086 A1 1/2002 Uchida et al.
2010/0124631 A1* 5/2010 Horio ....................... G02B 1/14
427/508

(Continued)

FOREIGN PATENT DOCUMENTS

JP 2000-912 A 1/2000
JP 2002-40213 A 2/2002
(Continued)

OTHER PUBLICATIONS

"Anti-smudge coating Optool DAC-100," Daikin, accessed on Feb. 4, 2025, pp. 1-3 [6 pages total], with an English translation.
(Continued)

*Primary Examiner* — Charles S Chang
(74) *Attorney, Agent, or Firm* — Birch, Stewart, Kolasch & Birch, LLP

(57) ABSTRACT

An antiglare film includes a substrate having a sheet-like shape, a lower hard coat layer disposed overlapping the substrate, and an upper hard coat layer disposed layered on a side of the lower hard coat layer opposite to a side of the substrate. A thickness of the lower hard coat layer is a value within a range of at least 150% or more of a thickness of the upper hard coat layer.

11 Claims, 4 Drawing Sheets

(56)　　　　References Cited

U.S. PATENT DOCUMENTS

| | | | |
|---|---|---|---|
| 2012/0237673 A1* | 9/2012 | Kuniyasu | G02B 1/04 |
| | | | 427/162 |
| 2017/0276838 A1 | 9/2017 | Oishi et al. | |
| 2020/0166678 A1 | 5/2020 | Sugawara et al. | |
| 2020/0398541 A1 | 12/2020 | Fujimoto et al. | |
| 2021/0141129 A1 | 5/2021 | Hayashi | |

FOREIGN PATENT DOCUMENTS

| | | |
|---|---|---|
| JP | 2008-129130 A | 6/2008 |
| JP | 2009-109702 A | 5/2009 |
| JP | 2010-78698 A | 4/2010 |
| JP | 2015-4979 A | 1/2015 |
| JP | 2017-33624 A | 2/2017 |
| JP | 2017-173163 A | 9/2017 |
| JP | 2019-142220 A | 8/2019 |
| JP | 6719677 B2 | 7/2020 |
| WO | WO 2016/047059 A1 | 3/2016 |
| WO | WO 2019/026471 A1 | 2/2019 |

OTHER PUBLICATIONS

"Elcom V-8000 series," JGC Catalysts & Chemicals Co., Ltd., Jan. 28, 2013, 3 pages total, with a partial English translation.

"MIBK-SD," Nissan Chemical Industries, Ltd., accessed on Nov. 1, 2024, 3 pages total, URL: <https://db.nissanchem.co.jp/db/detail.cgi?id=0230>, with a partial English translation.

"Omnirad 184 (former Irgacure 184)," IGM Resins B.V., accessed on Oct. 22, 2024, pp. 1-3 [4 pages total], URL: <https://www.tenkazai.com/product-igm/omnirad184.html>, with a partial English translation.

"Omnirad 907 (former Irgacure 907)," IGM Resins B.V., accessed on Oct. 30, 2024, pp. 1-3 [4 pages total], URL: <https://tenkazai.com/product-igm/omnirad907.html>, with a partial English translation.

"Pentaerythritol tetrakis (3-mercaptobutylate)," Karenz, CAS No. 31775-89-0, accessed on Nov. 1, 2024, 8 pages total, with an English translation.

"Shikoh™," Mitsubishi Chemical Group, accessed on Oct. 22, 2024, pp. 1-6 [12 pages total], with an English translation.

"Thiols," Wikipedia, accessed on Oct. 31, 2024, with a partial English translation.

Saruwatari, "Development of dendrimer and hyper-branched polymer to UV curable materials," Osaka Organic Chemical Report, accessed on Feb. 4, 2025, with a partial English translation.

English translation of the Taiwanese Search Report for Taiwanese Application No. 111120241, dated Sep. 15, 2023.

English translation of the Written Opinion of the International Searching Authority for International Application No. PCT/JP2021/046772, dated Feb. 8, 2022.

"Determination of magnitude of display sparkle," Japan Standards Association, JIS C 1006, Dec. 20, 2019, with partial English translation.

Japanese Office Action for Japanese Application No. 2021-103450, dated Feb. 20, 2024, with English translation.

* cited by examiner

ANTIGLARE FILM

TECHNICAL FIELD

The present disclosure relates to an antiglare film to be attached on a display of a display device.

BACKGROUND ART

Antiglare films are attached on surfaces of displays of various display devices. An antiglare film scatters, for example, external light incident on the display to make display contents of the display easy to view and protect the display from the outside. The antiglare film includes, for example, a surface on which shapes of fine recesses and protrusions are formed by surface roughening. As disclosed in Patent Document 1, for example, a surface structure of the antiglare film is formed by an antiglare layer in which fine particles (fillers) are dispersed in a matrix resin. Further, as disclosed in Patent Document 2, for example, this surface structure is formed by a co-continuous phase structure (phase separation structure) formed from a liquid phase of a plurality of polymers by spinodal decomposition.

CITATION LIST

Patent Document

Patent Document 1: JP 2009-109702 A
Patent Document 2: JP 2002-40213 A

SUMMARY OF INVENTION

Technical Problem

When the antiglare film is attached on the surface of the display, light exiting the display is refracted by the recesses and protrusions at the surface of the antiglare film, or pixels of the display appear magnified due to a lens effect of the recesses and protrusions at the surface of the antiglare film. This causes sparkle, deteriorating the apparent display performance of the display. This sparkle is conspicuous when the display includes high-resolution pixels of, for example, 400 ppi or greater.

Examples of methods of suppressing sparkle include a method of reducing in size the recesses and protrusions at the surface of the antiglare film in accordance with the pixel size of the display. In this case, in the configuration of Patent Document 1, it is necessary to make the antiglare layer thinner to prevent the particles from being buried. Further, in the configuration of Patent Document 2, it is necessary to make the co-continuous phase structure portion thinner to facilitate formation of shapes of intended recesses and protrusions at the film surface. As a result, in both Patent Documents 1 and 2, the antiglare film decreases in hardness and decreases in durability.

In view of this, an object of the present disclosure is to achieve antiglare properties, favorably suppress sparkle, and prevent a decrease in hardness of an antiglare film when the antiglare film is attached on a surface of a display including high-resolution pixels.

Solution to Problem

An antiglare film according to an aspect of the present disclosure includes a substrate having a sheet-like shape, a lower hard coat layer disposed overlapping the substrate, and an upper hard coat layer disposed and layered on a side of the lower hard coat layer opposite to a side of the substrate. A thickness of the lower hard coat layer is a value within a range of at least 150% or more of a thickness of the upper hard coat layer.

According to the configuration described above, the upper hard coat layer can be supported by the lower hard coat layer. Further, the upper hard coat layer can be configured separately from the lower hard coat layer. This makes it possible to make the upper hard coat layer thinner, and easily form shapes of fine recesses and protrusions at the side of the upper hard coat layer opposite to the lower hard coat layer. As a result, it is possible to appropriately the suppress sparkle that occurs when an antiglare film is attached on a display including high-resolution pixels. Further, the thickness of the lower hard coat layer is a value within a range of at least 150% or more of the thickness of the upper hard coat layer. Accordingly, even when this upper hard coat layer is made thinner, the thickness of the hard coat layers as a whole can be maintained to some extent. This makes it possible to prevent a decrease in hardness of the antiglare film caused by insufficient thickness of the hard coat layers. As a result, it is possible to prevent a decrease in durability of the antiglare film.

In a state in which the antiglare film is attached on a surface of an organic electroluminescent (EL) display having a pixel density of 441 ppi, a standard deviation of luminance distribution of the display as measured by a method compliant with JIS C 1006:2019 may be a value within a range from 0 to 12 when the display is adjusted to obtain image data as a gray scale image in 8-bit gradation display with an average luminance of 170 tones.

Here, the standard deviation of the luminance distribution of the display indicates a degree of variation in brightness on the display. Sparkle is caused by the brightness on the display. Accordingly, the magnitude of sparkle corresponds to the value of the standard deviation of the luminance distribution of the display. The greater the value of the standard deviation of the luminance distribution of the display, the greater the extent of the sparkle. The less the value of the standard deviation of the luminance distribution of the display, the less the extent of the sparkle. As a result, the standard deviation of the luminance distribution of the display can be used as an objective index for quantitatively evaluating the sparkle. Further, by using an organic EL display including high-resolution pixels and setting the standard deviation of the luminance distribution of the display, it is possible to suppress sparkle caused by incident light having a wide range of exit angles from pixels, which is specific to self-luminous displays including high-resolution pixels.

Accordingly, according to the configuration described above, by using a self-luminous organic EL display including high-resolution pixels and setting the standard deviation of the luminance distribution of the display to a value within the range from 0 to 12 on the basis of the setting conditions described above, it is possible to favorably suppress sparkle even in a harsh usage mode of an antiglare film in which sparkle is likely to occur.

A haze value may be a value within a range from 0.5% to 25%. With the haze value thus set, the light incident on the antiglare film can be scattered while the light exiting from the display is appropriately transmitted through the antiglare film. Thus, favorable antiglare properties can be obtained.

A pencil hardness of a surface of the upper hard coat layer on a side opposite to the lower hard coat layer may be a value within a range of 4H or greater. Accordingly, in a state in which the antiglare film is attached on the surface of the display, it is possible to prevent the antiglare film from being dented by an external force, even when some object comes into contact with the antiglare film from the outside. Further, optical characteristics of the antiglare film can be maintained while improving the durability of the antiglare film, making the surface of the antiglare film less likely to be scratched.

A thickness of the upper hard coat layer may be a value within a range from 3 µm to 6 µm. This makes is possible to make the upper hard coat layer thinner while supporting the upper hard coat layer by the lower hard coat layer. As a result, it is possible to easily form shapes of recesses and protrusions at the surface of the antiglare film, and thus suppress sparkle while achieving favorable antiglare properties.

A thickness of the lower hard coat layer may be a value within a range from 10 µm to 20 µm. Accordingly, an appropriate hardness can be easily imparted to the antiglare film, and unnecessary curling of the antiglare film can be easily suppressed. Further, the thickness of the lower hard coat layer can be maintained to some extent, and the hardness of the hard coat layers as a whole can be easily improved.

The upper hard coat layer may include an upper matrix resin, and recess and protrusion forming particles dispersed in the upper matrix resin and having an average particle size within a range from 0.5 µm to 5.0 µm. As a result, it is possible to easily form the surface shape of the antiglare film by utilizing the matrix resin and the recess and protrusion forming particles while maintaining the hardness of the hard coat layers as a whole, and thus it is possible to suppress sparkle while achieving favorable antiglare properties.

A difference in refractive index between the upper matrix resin and the recess and protrusion forming particles may be a value within a range from 0 to 0.20. This makes it possible to suppress light reflection at an interface between the matrix resin and the recess and protrusion forming particles. Accordingly, this makes it possible to suppress unnecessary influence caused by light reflection. As a result, an antiglare film having favorable optical characteristics can be realized.

Alternatively, the upper hard coat layer may include a plurality of resin components and may have a co-continuous phase structure formed by phase separation of the plurality of resin components. As a result, it is possible to easily form the surface shape of the antiglare film by utilizing the co-continuous phase structure while maintaining the hardness of the hard coat layers as a whole, and thus it is possible to suppress sparkle while achieving favorable antiglare properties.

The lower hard coat layer may include a lower matrix resin, and fine particles dispersed in the lower matrix resin and having an average particle size within a range from 5 nm to 100 nm. Thus, the lower hard coat layer can be formed using the matrix resin and the fine particles. As a result, the lower hard coat layer can have an improved degree of freedom of design.

The antiglare film may include at least one antireflection layer disposed and layered on a side of the upper hard coat layer opposite to the lower hard coat layer. This makes it possible to prevent external light from being reflected on the surface of the display via the antiglare film in a state in which the antiglare film is attached on the surface of the display. Thus, it is possible to further improve the apparent display performance of the display when the antiglare film is attached on the surface of the display.

The at least one antireflection layer disposed in contact with the upper hard coat layer may include metal oxide particles. With the antireflection layer having such a configuration, the at least one antireflection layer can be efficiently formed by, for example, a sputtering method or a vapor deposition method.

Advantageous Effects of Invention

According to each aspect of the present disclosure, it is possible to achieve favorable antiglare properties, favorably suppress sparkle, and prevent a decrease in hardness of an antiglare film when the antiglare film is attached on a surface of a display including high-resolution pixels.

DESCRIPTION OF EMBODIMENTS

Embodiments of the present disclosure will be described below with reference to the drawings. The term "sparkle" as used herein refers to the phenomenon defined in JIS C 1006:2019.

First Embodiment

Figure 1:
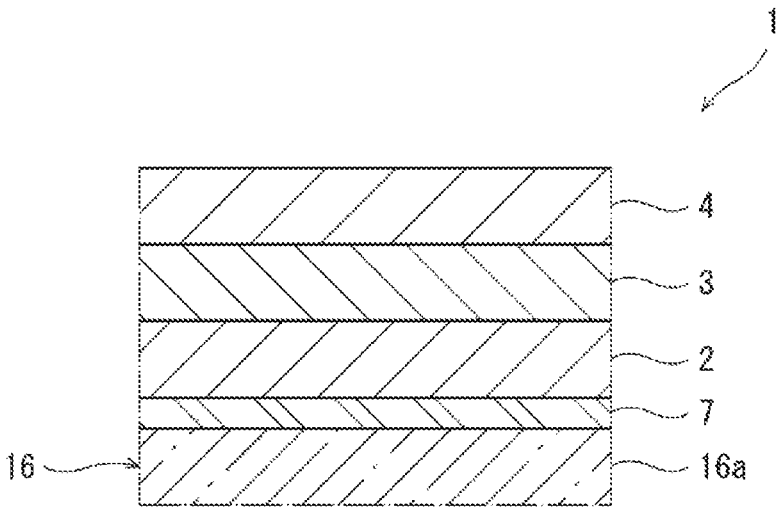
FIG. 1 is a schematic cross-sectional view of an antiglare film according to a first embodiment.
Figure 2:
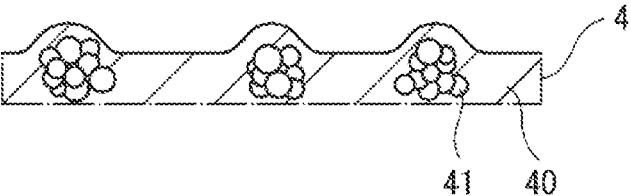
FIG. 2 is a partial cross-sectional view of an upper hard coat layer in FIG. 1.

FIG. 1 is a cross-sectional view illustrating a configuration of an antiglare film 1 according to a first embodiment. FIG. 2 is a partial cross-sectional view of an upper hard coat layer 4 in FIG. 1. The antiglare film 1 is attached on a surface of a display 16a of a display device 16 (refer to FIG. 3). The antiglare film 1 prevents sparkle by scattering incident light incident on the display 16a. Further, the antiglare film 1 protects the display 16a from the outside. The antiglare film 1 suppresses sparkle in a state of being attached on the surface of the display 16a. Thus, the antiglare film 1 has a plurality of functions.

The types of the display device 16 and the display 16a are not limited. The display device 16 can be exemplified by a personal computer (PC), a television, and a smartphone. The display 16a can be exemplified by known displays such as a liquid crystal display (LCD), an organic electroluminescent (EL) display (OLED), an inorganic EL display, and a plasma display panel (PDP). The display 16a of the present embodiment is, as an example, of a self-luminous type, and is an organic EL display herein. Further, the display 16a includes high-resolution pixels having a pixel density of 400 ppi or greater. The pixel density of the display 16a may be, for example, a value within any one range of 500 ppi or greater, 600 ppi or greater, 700 ppi or greater, or 800 ppi or greater. Further, the display 16a may be of a self-luminous type or a transmissive type. The pixel array of the display 16a may be a matrix array or a PenTile array. For the PenTile array, reference can be made to the description in JP 6653020 B, for example.

As illustrated in FIGS. 1 and 2, as an example, the antiglare film 1 includes a substrate 2, a lower hard coat layer 3, the upper hard coat layer 4, and an adhesive layer 7. The substrate 2 is disposed between the display 16a and the lower hard coat layer 3, and supports the lower hard coat layer 3. The adhesive layer 7 is disposed between the display 16*a* and the substrate 2, and fixes the antiglare film 1 to the surface of the display 16*a*. The adhesive layer 7 includes, for example, an optical glue. The adhesive layer 7 is made of a material that is unlikely to affect optical characteristics of the antiglare film 1.

The substrate 2 is disposed between the display 16*a* and the lower hard coat layer 3. The substrate 2 is formed in a sheet-like shape. The substrate 2 supports the hard coat layers 3, 4. The adhesive layer 7 is disposed between the display 16*a* and the substrate 2. The adhesive layer 7 fixes the antiglare film 1 to the surface of the display 16*a*. As an example, the adhesive layer 7 detachably fixes the antiglare film 1 to the surface of the display 16*a*, but no such limitation is intended.

The materials of the substrate 2 can be exemplified by glass, ceramic, and resin. As the resin, for example, a resin similar to a material of the lower hard coat layer 3 can be used. The preferable material of the substrate 2 can be exemplified by a transparent polymer such as a cellulose derivative (cellulose acetate such as cellulose triacetate (TAC) and cellulose diacetate, and the like), a polyester resin (polyethylene terephthalate (PET), polyethylene naphthalate (PEN), polybutylene terephthalate (PBT), polyarylate resin, and the like), a polysulfone resin (polysulfone, polyether sulfone (PES), and the like), a polyetherketone resin (polyetherketone (PEK), polyetheretherketone (PEEK), and the like), a polycarbonate resin (PC), a polyolefin resin (polyethylene, polypropylene, and the like), a cyclic poly-olefin resin (a film "ARTON" (trade name) available from JSR Corporation, a film "ZEONEX" (trade name) available from Zeon Corporation, and the like), a halogen-containing resin (polyvinylidene chloride, and the like), a (meth)acrylic resin, a styrene resin (polystyrene, and the like), and a vinyl acetate or vinyl alcohol resin (polyvinyl alcohol, and the like).

The substrate 2 may be uniaxially or biaxially stretched. Preferably, the substrate 2 is optically isotropic and has a low refractive index, for example. The substrate 2 that is optically isotropic can be exemplified by unstretched films.

A thickness dimension of the substrate 2 can be set as appropriate. The thickness dimension of the substrate 2 is, for example, preferably a value within a range from 5 μm to 2000 μm, more preferably within a range from 15 μm to 1000 μm, and still more preferably a value within a range from 20 μm to 500 μm.

The hard coat layers 3, 4 of the present embodiment may each have a higher hardness than that of the substrate 2. Further, the lower hard coat layer 3 may be more transparent than the upper hard coat layer 4. In this case, the lower hard coat layer 3 may have a higher total light transmittance than the upper hard coat layer 4. The lower hard coat layer 3 improves a hardness of the antiglare film 1. The hardness as used herein can be indicated as a value of pencil hardness measured by scratch hardness (pencil method) in accordance with JIS K 5600-5-4:1999, for example. The lower hard coat layer 3 is disposed overlapping the substrate 2. The lower hard coat layer 3 also functions as an anchor layer for fixing the upper hard coat layer 4 to the substrate 2 side. A surface of the lower hard coat layer 3 on the upper hard coat layer 4 side may be smoother than a surface of the upper hard coat layer 4 on the lower hard coat layer 3 side.

A thickness of the lower hard coat layer 3 is a value within a range of at least 150% or more of a thickness of the upper hard coat layer 4. As a result, the lower hard coat layer 3 has a more sufficient thickness than the upper hard coat layer 4. The lower hard coat layer 3 of the present embodiment may have a higher hardness than that of the upper hard coat layer 4. Increasing the thickness of the lower hard coat layer 3 increases the hardness of the antiglare film 1 as a whole. As an example, the thickness of the lower hard coat layer 3 is a value within a range of at least from 150% to 450% of the thickness of the upper hard coat layer 4. The thickness of the lower hard coat layer 3 is, for example, preferably a value within a range from 200% to 450%, more preferably a value within a range from 250% to 400%, and still more preferably a value within a range from 250% to 350%.

Further, for example, the thickness of the lower hard coat layer 3 is a value within a range from 10 μm to 20 μm. In another example, the thickness of the lower hard coat layer 3 is a value within a range from 5 μm to 20 μm. Further, the thickness of the lower hard coat layer 3 is, for example, preferably a value within a range from 8 μm to 20 μm, and more preferably a value within a range from 10 μm to 20 μm. By setting the thickness of the lower hard coat layer 3 to a value within a range greater than 5 μm, it is possible to prevent damage such as cracking of the lower hard coat layer 3 and easily impart appropriate hardness to the antiglare film 1. By setting the thickness of the lower hard coat layer 3 to a value within a range of 20 μm or less, it is possible to easily suppress unnecessary curling of the antiglare film 1.

The lower hard coat layer 3 includes a lower matrix resin 30 and fine particles 31 dispersed in the lower matrix resin 30. The fine particles 31 have, as an example, an average particle size within a range from 5 nm to 100 nm. The average particle size of the fine particles 31 is, for example, preferably a value within a range from 5 nm to 50 nm, and more preferably a value within a range from 10 nm to 20 nm. The average particle size as used herein refers to a 50% volume average particle size in the Coulter counter method (the same applies to the other average particle sizes referred to below).

The fine particles 31 are formed into perfectly spherical shapes, but the shape is not limited thereto. As an example, the fine particles 31 may be formed into spherical shapes or ellipsoidal shapes. Further, as an example, the fine particles 31 are formed into solid forms, but may be formed into hollow forms. When the fine particles 31 are formed into hollow forms, a hollow portion of each of the fine particles 31 may be filled with air or other gases.

As an example, a difference in refractive index between the lower matrix resin 30 and the fine particles 31 is set to a value within a range from 0 to 0.20. This difference in refractive index is, for example, preferably a value within a range from 0 to 0.15, and more preferably a value within a range from 0 to 0.10. Thus, unnecessary reflection of inci-dent light at the interface between the lower matrix resin 30 and the fine particles 31 is suppressed.

A mass ratio between the lower matrix resin 30 and the fine particles 31 in the lower hard coat layer 3 can be set as appropriate. For example, a ratio G2/G1 of a total weight G2 of the fine particles 31 in the lower hard coat layer 3 to a total weight G1 of the lower matrix resin 30 in the lower hard coat layer 3 is set to a value within a range from 0.5 to 3.0. The ratio G2/G1 is, for example, preferably a value within a range from 1.0 to 3.0, and more preferably a value within a range from 1.5 to 3.0.

The lower matrix resin 30 can be exemplified by a photocurable resin cured by an active energy ray, a cured product of at least one thermosetting resin, and a solvent-drying resin that cures through drying of a solvent added during coating.

The photocurable resin can be exemplified by urethane (meth)acrylate (oligomers), epoxy (meth)acrylate (oligomers), polyether (meth)acrylate (oligomers), polyester (meth) acrylate (oligomers), and (meth)acrylate (oligomers).

When a photocurable resin is used, a reactive diluent may be used in combination. Specific examples of the reactive diluent can be exemplified by monofunctional monomers, such as ethyl(meth)acrylate, ethylhexyl(meth)acrylate, styrene, methylstyrene, and N-vinylpyrrolidone; and multifunctional monomers, such as, for example, polymethylol-propane tri(meth)acrylate, hexanediol (meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth) acrylate, and neopentyl glycol di(meth)acrylate.

When the photocurable resin is an ultraviolet curable resin, a photopolymerization initiator is preferably used. The photopolymerization initiator can be exemplified by acetophenones, benzophenones, Michler's benzoyl benzoate, $\alpha$-amyloxime ester, tetramethylthiuram monosulfide, and thioxanthones. In addition, a photosensitizer is preferably mixed with the photocurable resin for use. The photosensitizer can be exemplified by n-butylamine, triethylamine, and poly-n-butylphosphine.

The solvent-drying resin can be exemplified by well-known thermoplastic resins. This thermoplastic resin can be exemplified by styrene resins, (meth)acrylic resins, vinyl acetate resins, vinyl ether resins, halogen-containing resins, alicyclic olefin resins, polycarbonate resins, polyester resins, polyamide resins, cellulose derivatives, silicone resins, and rubbers or elastomers. The material of the solvent-drying resin is preferably soluble in an organic solvent. Further, the solvent-drying resin is preferably excellent in moldability, film formability, transparency, and weather resistance. Such a solvent-drying resin can be exemplified by styrene resins, (meth)acrylic resins, alicyclic olefin resins, polyester resins, and cellulose derivatives (such as cellulose esters).

Here, when the material of the substrate 2 is a cellulosic resin such as triacetyl cellulose (TAC), a thermoplastic resin used in a solvent-drying resin can be exemplified by a cellulosic resin. This cellulosic resin can be exemplified by cellulose derivatives, such as nitrocellulose, acetyl cellulose, acetyl butyl cellulose, ethyl cellulose, methyl cellulose, cellulose acetate propionate, and ethyl hydroxyethyl cellulose. The cellulosic resin is used as the solvent-drying resin, and thus the substrate 2 and the lower hard coat layer 3 can be favorably brought into close contact with each other. Also, excellent transparency of the antiglare film 1 can be achieved.

Further, the thermosetting resin can be exemplified by phenolic resins, urea resins, diallyl phthalate resins, melamine resins, guanamine resins, unsaturated polyester resins, polyurethane resins, epoxy resins, amino alkyd resins, melamine-urea co-condensed resins, silicon resins, and polysiloxane resins. When a thermosetting resin is used, at least one of a curing agent, such as a crosslinker or a polymerization initiator, a polymerization accelerator, a solvent, a viscosity modifier, or the like may be used in combination.

The fine particles 31 can be exemplified by inorganic fine particles. The inorganic fine particles can be exemplified by fine particles of silica ($SiO_2$), zirconia, titania ($TiO_2$), and other various metal oxides. The metal oxides can be exemplified by indium tin oxide, tin oxide, indium oxide, germanium oxide, zinc oxide, and aluminum oxide. The inorganic fine particles can be exemplified by metal fluoride particles, metal sulfide particles, metal nitride particles, and metal particles. As the fine particles 31, for example, those having favorable transparency are preferred. For example, in the case of a configuration in which the fine particles 31 include silica, such as nanosilica particles, the hardness of the antiglare film 1 can be easily improved.

The upper hard coat layer 4 is disposed and layered on the side of the lower hard coat layer 3 opposite to the substrate 2 side. As an example, the upper hard coat layer 4 includes an upper matrix resin 40, and recess and protrusion forming particles 41 dispersed in the upper matrix resin 40. The upper matrix resin 40 may include, as an example, a material similar to that of the lower matrix resin 30. The matrix resins 30, 40 of the present embodiment have different compositions. As an example, in a case in which the lower matrix resin 30 includes a urethane resin, the upper matrix resin 40 includes an acrylic resin. Further, as an example, the recess and protrusion forming particles 41 may have an average particle size within a range from 0.5 μm to 5.0 μm. The average particle size of the recess and protrusion forming particles 41 is, for example, preferably a value within a range from 0.5 μm to 3.0 μm, and more preferably a value within a range from 0.5 μm to 2.0 μm. As an example, the material of the recess and protrusion forming particles 41 may include the material of the fine particles 31.

Further, a difference in refractive index between the upper matrix resin 40 and the recess and protrusion forming particles 41 may be the same as or different from the difference in refractive index between the lower matrix resin 30 and the fine particles 31. The difference in refractive index between the upper matrix resin 40 and the recess and protrusion forming particles 41 is a value within a range from 0 to 0.20. In this case, this difference in refractive index is, for example, preferably a value within a range from 0 to 0.15, and more preferably a value within a range from 0 to 0.07. The fine particles 31 in the lower matrix resin 30 and the recess and protrusion forming particles 41 in the upper matrix resin 40 can be confirmed by, for example, observing a cross section of the antiglare film 1 using a scanning electron microscope (SEM) or a transmission electron microscope (TEM).

The thickness of the upper hard coat layer 4 can be set as appropriate. As an example, the thickness of the upper hard coat layer 4 is a value within a range from 3 μm to 6 μm. Further, the thickness of the upper hard coat layer 4 is, for example, more preferably a value within a range from 3 μm to 5 μm, and even more preferably a value within a range from 3 μm to 4 μm. By setting the thickness of the upper hard coat layer 4 to 3 μm or greater, it is possible to easily maintain the hardness of the upper hard coat layer 4. Further, by setting the thickness of the upper hard coat layer 4 to a value within the range of 6 μm or less, the recess and protrusion forming particles 41 are caused to outwardly protrude from the surface on the side opposite to the lower hard coat layer 3, and the shapes of recesses and protrusions at the surface of the upper hard coat layer 4 can be easily formed.

A haze value of the antiglare film 1 is adjusted by changing at least one of the respective surface shapes of the hard coat layers 3, 4 or the respective compositions of the hard coat layers 3, 4, for example. Further, the hardness of the antiglare film 1 is adjusted by, for example, changing the materials of the hard coat layers 3, 4. As a result, in the antiglare film 1, as an example, the haze value is a value within a range from 0.5% to 25%, and a pencil hardness of the surface of the upper hard coat layer 4 on the side opposite to the lower hard coat layer 3 is set to a value within a range of 4H or greater. The pencil hardness as used herein refers to a value measured by scratch hardness (pencil method) in accordance with JIS K 5600-5-4:1999. The haze value of the antiglare film 1 is, for example, preferably a value within a range from 5% to 20%, and more preferably a value within a range from 10% to 15%.

When the pencil hardness of the surface of the upper hard coat layer 4 of the antiglare film 1 on the side opposite to the lower hard coat layer 3 is set to a value within the range of 4H or greater, it is possible to prevent, in a state in which the antiglare film 1 is attached on the surface of the display 16*a*, the antiglare film 1 from being dented by an external force, even when some object comes into contact with the antiglare film 1 from the outside. Further, it is possible to maintain the optical characteristics of the antiglare film 1 while improving the durability of the antiglare film 1, making the surface of the antiglare film less likely to be scratched.

Further, in the antiglare film 1, the shapes of the fine recesses and protrusions present on the surface on the side opposite to the display 16*a* are set, and thus the sparkle generated when the antiglare film 1 is attached on the surface of the display 16*a* including high-resolution pixels can be appropriately suppressed. Here, sparkle is caused by the brightness of the display. Accordingly, the magnitude of sparkle corresponds to the value of the standard deviation of the luminance distribution of the display. The greater the value of the standard deviation of the luminance distribution of the display, the greater the extent of the sparkle. The less the value of the standard deviation of the luminance distribution of the display, the less the extent of the sparkle. As a result, the standard deviation of the luminance distribution of the display can be used as an objective index for quantitatively evaluating the sparkle.

Here, the shapes of recesses and protrusions at the surface is set, and thus a standard deviation of luminance distribution of the display 16*a* when the antiglare film 1 is attached on the display 16*a* is suppressed to a value within a predetermined range. Specifically, in the antiglare film 1, as an example, in a state in which the antiglare film 1 is attached on a surface of the organic electroluminescent (EL) display 16*a* having a pixel density of 441 ppi, the standard deviation of luminance distribution of the display 16*a* as measured by a method compliant with JIS C 1006:2019 is a value within a range from 0 to 12 when the display 16*a* is adjusted to obtain image data as a gray scale image in 8-bit gradation display with an average luminance of 170 tones. This standard deviation of the luminance distribution of the display is measured using, for example, a sparkle measurement apparatus 10 described below. Sparkle is suppressed on the basis of the standard deviation of the luminance distribution of the display 16*a*. As a result, the antiglare film 1 can achieve a stable sparkle suppression effect on the basis of an objective index as compared with a case in which sparkle is suppressed by, for example, sensory evaluation by a person or evaluation of a friction coefficient or the like easily affected by a surface state.

As described above, according to the antiglare film 1, the upper hard coat layer 4 can be supported by the lower hard coat layer 3. Further, the upper hard coat layer 4 can be configured separately from the lower hard coat layer 3. Therefore, the upper hard coat layer 4 can be made thinner, and shapes of fine recesses and protrusions can be easily formed on the side of the upper hard coat layer 4 opposite to the lower hard coat layer 3. As a result, it is possible to appropriately suppress the sparkle that occurs when the antiglare film 1 is attached on the surface of the display 16*a* including high-resolution pixels. Further, the thickness of the lower hard coat layer 3 is at least 150% or more of the thickness of the upper hard coat layer 4. Accordingly, even when this upper hard coat layer 4 is made thinner, the thickness of the hard coat layers 3, 4 as a whole can be maintained to some extent. This makes it possible to prevent a decrease in hardness of the antiglare film 1 caused by insufficient thickness of the hard coat layers 3, 4. As a result, it is possible to prevent a decrease in durability of antiglare film 1.

Further, in the antiglare film 1, as an example, in a state in which the antiglare film 1 is attached on a surface of an organic electroluminescent (EL) display having a pixel density of 441 ppi, the standard deviation of luminance distribution of the display as measured by a method compliant with JIS C 1006:2019 is a value within a range from 0 to 12 when the display is adjusted to obtain image data as a gray scale image in 8-bit gradation display with an average luminance of 170 tones. Thus, by using an organic EL display including high-resolution pixels and setting the standard deviation of the luminance distribution of the display, it is possible to suppress sparkle caused by incident light having a wide range of exit angles from pixels, which is specific to self-luminous displays including high-resolution pixels. Accordingly, by using a self-luminous organic EL display including high-resolution pixels and setting the standard deviation of the luminance distribution of the display to a value within the range from 0 to 12 on the basis of the setting conditions described above, it is possible to favorably suppress sparkle even in a harsh usage mode of an antiglare film 1 in which sparkle is likely to occur.

Further, as an example, in the antiglare film 1, the thickness of the upper hard coat layer 4 is a value within the range from 3 μm to 6 μm. This makes it possible to make the upper hard coat layer 4 thinner while supporting the upper hard coat layer 4 by the lower hard coat layer 3. As a result, it is possible to easily form shapes of recesses and protrusions at the surface of the antiglare film 1, and thus suppress sparkle while achieving favorable antiglare properties.

Further, the antiglare film 1 has, as an example, a haze value that is at a value within the range from 0.5% to 25%. With the haze value thus set, the light incident on the antiglare film 1 can be scattered while the light exiting from the display 16*a* is appropriately transmitted through the antiglare film 1. Thus, favorable antiglare properties can be obtained.

Further, as an example, in the antiglare film 1, the pencil hardness of the surface of the upper hard coat layer 4 on a side opposite to the lower hard coat layer 3 is a value within the range of 4H or greater. This makes it possible to maintain the optical characteristics of the antiglare film 1 while improving the durability of the antiglare film 1 in a state in which the antiglare film 1 is attached on the surface of the display 16*a*.

Further, as an example, in the antiglare film 1, the thickness of the lower hard coat layer 3 is a value within the range from 10 μm to 20 μm. As a result, an appropriate hardness can be easily imparted to the antiglare film 1, and unnecessary curling of the antiglare film 1 can be easily suppressed. Further, the thickness of the lower hard coat layer 3 can be maintained to some extent, and the hardness of the hard coat layers 3, 4 as a whole can be easily improved.

Further, as an example, the upper hard coat layer 4 includes the upper matrix resin 40, and the recess and protrusion forming particles 41 dispersed in the upper matrix resin 40 and having an average particle size within the range from 0.5 μm to 5.0 μm. As a result, it is possible to easily form the surface shape of the antiglare film 1 by utilizing the upper matrix resin 40 and the recess and protrusion forming particles 41 while maintaining the hardness of the hard coat layers 3, 4 as a whole, and thus it is possible to suppress sparkle while achieving favorable antiglare properties.

Further, as an example, the lower hard coat layer 3 includes the lower matrix resin 30, and the fine particles 31 dispersed in the lower matrix resin 30 and having an average particle size within a range from 5 nm to 100 nm. Thus, the lower hard coat layer 3 can be configured using the lower matrix resin 30 and the fine particles 31. As a result, the lower hard coat layer 3 can have an improved degree of freedom of design.

Further, as an example, the difference in refractive index between the upper matrix resin 40 and the recess and protrusion forming particles 41 is a value within the range from 0 to 0.20. This makes it possible to suppress light reflection at the interface between the upper matrix resin 40 and the recess and protrusion forming particles 41. Accordingly, this makes it possible to suppress unnecessary influence caused by light reflection. As a result, the antiglare film 1 having favorable optical characteristics can be realized.

Further, in the present embodiment, as an example, the lower hard coat layer 3 has a higher hardness than that of the upper hard coat layer 4. As a result, the upper hard coat layer 4 can be more stably supported by the lower hard coat layer 3. Further, the hardness of the hard coat layers 3, 4 as a whole can be easily maintained. Another embodiment will be described below focusing on differences from the first embodiment.

Second Embodiment

Figure 3:
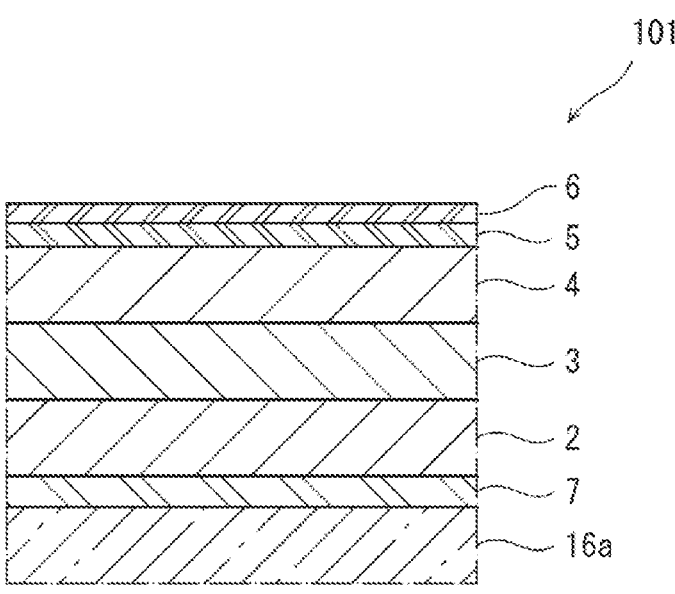
FIG. 3 is a schematic cross-sectional view of an antiglare film according to a second embodiment.

FIG. 3 is a schematic cross-sectional view of an antiglare film 101 according to a second embodiment. As illustrated in FIG. 3, as an example, the antiglare film 101 differs from the antiglare film 1 in that the antiglare film 101 includes at least one antireflection (AR) layer disposed and layered on the side of the upper hard coat layer 4 opposite to the lower hard coat layer 3. The antiglare film 101 of the present embodiment includes a lower antireflection layer 5 and an upper antireflection layer 6. The antireflection layers 5, 6 are, as an example, thin films formed by a sputtering method or a vapor deposition method. In a case in which a plurality of the antireflection layers 5, 6 are used, the plurality of antireflection layers 5, 6 are disposed overlapping each other in a thickness direction.

The antireflection layer disposed in contact with the upper hard coat layer 4 (here, the lower antireflection layer 5) includes, as an example, metal oxide particles. The metal oxide can be exemplified by $SiO_2$, $ZrO_2$, and $NbO_2$, but is not limited thereto. The lower antireflection layer 5 is disposed overlapping the upper hard coat layer 4. The upper antireflection layer 6 is disposed overlapping the lower antireflection layer 5. The antireflection layers 5, 6 impart antireflection characteristics to the antiglare film 101 by roughening the surface of the antiglare film 101.

According to the antiglare film 101, it is possible to prevent external light from being reflected on the surface of the display 16a via the antiglare film 101 in a state in which the antiglare film 101 is attached on the surface of the display 16a. This makes it possible to further improve the apparent display performance of the display 16a when the antiglare film 101 is attached on the surface of the display 16a. Further, as the lower antireflection layer 5 disposed in contact with the upper hard coat layer 4 includes metal oxide particles, the antireflection layer 5 can be efficiently formed by, for example, a sputtering method or a vapor deposition method.

Third Embodiment

In an antiglare film according to a third embodiment, the upper hard coat layer 4 includes a plurality of resin components and has a co-continuous phase structure (phase separation structure) formed by phase separation of the plurality of resin components. On the surface of the upper hard coat layer 4, for example, a plurality of long and narrow (string-like or linear) protrusions are formed. The long and narrow protrusions are branched. On the surface of the upper hard coat layer 4, a co-continuous phase structure in which the plurality of long and narrow protrusions are densely disposed is formed.

The upper hard coat layer 4 manifests antiglare properties by the plurality of long and narrow protrusions, and recesses located between the long and narrow protrusions adjacent to each other. With such an upper hard coat layer 4 included, the antiglare film has excellent balance between the haze value and transmission image clarity (image clarity). The surface of the upper hard coat layer 4 has the long and narrow protrusions formed in a substantially mesh shape and thus has a mesh structure, in other words, a plurality of irregular loop structures that are continuous or partially missing. Here, in the antiglare film of the present embodiment as well, the thickness of the lower hard coat layer 3 is a value within the range of at least 150% or more of the thickness of the upper hard coat layer 4, as in the antiglare film 1.

Further, as an example, the upper hard coat layer 4 has a thickness that is at a value within the range from 3 μm to 6 μm. This makes it possible to make the upper hard coat layer 4 thinner while supporting the upper hard coat layer 4 by the lower hard coat layer 3. By making the upper hard coat layer 4 thinner, it is possible to easily form, in the upper hard coat layer 4, shapes of recesses and protrusions suitable for suppressing sparkle by the co-continuous phase structure formed by phase separation of the plurality of resin components.

The surface of the upper hard coat layer 4 prevents formation of a protrusion having a lens shape (island shape). This prevents the light passing through the upper hard coat layer 4 from the display 16a from being refracted by the recesses and protrusions at the surface of the upper hard coat layer 4, and pixels of the display 16a from appearing magnified due to a lens effect of the recesses and protrusions at the surface of upper hard coat layer 4. As a result, the sparkle of the display 16a due to the lens effect is suppressed. Accordingly, with the antiglare film 1 attached on the display 16a including high-resolution pixels, it is possible to achieve antiglare properties, suppress the sparkle of the display 16a to a high degree, and suppress the blurring of text and images.

Note that the plurality of long and narrow protrusions may be independent of each other or may be connected to each other. The co-continuous phase structure of the upper hard coat layer 4 is, as described below, formed by spinodal decomposition (wet spinodal decomposition) from the liquid phase using a solution that serves as a raw material of the upper hard coat layer 4. For details of the co-continuous phase structure, reference can be made to the description of, for example, JP 6190581 B.
Material of Upper Hard Coat Layer The plurality of resin components included in the upper hard coat layer 4 need only be phase-separable resin components. To obtain the upper hard coat layer 4 including the long and narrow protrusions formed therein and having high scratch resistance, preferably the plurality of resin components include a polymer and a curable resin, for example.

The polymer can be exemplified by thermoplastic resins. The thermoplastic resin can be exemplified by styrene resins, (meth)acrylic resins, organic acid vinyl ester resins, vinyl ether resins, halogen-containing resins, olefin resins (including alicyclic olefin resins), polycarbonate resins, polyester resins, polyamide resins, thermoplastic polyurethane resins, polysulfone resins (such as polyether sulfone and polysulfone), polyphenylene ether resins (such as a polymer of 2,6-xylenol), cellulose derivatives (such as cellulose esters, cellulose carbamates, and cellulose ethers), silicone resins (such as polydimethylsiloxane and polymethylphenylsiloxane), and rubbers or elastomers (diene rubbers, such as polybutadiene and polyisoprene; styrene-butadiene copolymers; acrylonitrile-butadiene copolymers; acrylic rubber; urethane rubber; and silicone rubber). These thermoplastic resins can be used alone or in combination of two or more. In addition, the polymer can also be exemplified by polymers including a functional group involved in a curing reaction or polymers including a functional group reacting with a curable compound. The polymer may have a functional group in the main chain or side chain.

The functional group can be exemplified by condensable groups, reactive groups (for example, a hydroxyl group, an acid anhydride group, a carboxyl group, an amino group or an imino group, an epoxy group, a glycidyl group, or an isocyanate group), and polymerizable groups (for example, $C_{2-6}$ alkenyl groups such as vinyl, propenyl, isopropenyl, butenyl, and allyl groups, $C_{2-6}$ alkynyl group such as ethynyl, propynyl, and butynyl groups, $C_{2-6}$ alkenylidene groups such as a vinylidene group, or a group (such as a (meth) acryloyl group) including a polymerizable group thereof). Among these functional groups, polymerizable groups are preferred.

Further, the upper hard coat layer 4 may include a plurality of types of polymers. Each of these polymers may be phase separable by spinodal decomposition from a liquid phase or may be mutually immiscible. The combination of a first polymer and a second polymer included in the plurality of types of polymers is not particularly limited, but polymers mutually immiscible at or near a processing temperature can be used.

For example, when the first polymer is a styrene resin (such as polystyrene or a styrene-acrylonitrile copolymer), the second polymer can be exemplified by a cellulose derivative (for example, a cellulose ester such as cellulose acetate propionate), a (meth)acrylic resin (such as polymethyl methacrylate), an alicyclic olefin resin (such as a polymer containing norbornene as a monomer), a polycarbonate resin, or a polyester resin (such as a poly $C_{2-4}$ alkylene arylate-based copolyester).

Also, for example, when the first polymer is a cellulose derivative (for example, a cellulose ester such as cellulose acetate propionate), the second polymer can be exemplified by a styrene resin (such as polystyrene or a styrene-acrylonitrile copolymer), a (meth)acrylic resin, an alicyclic olefin resin (such as a polymer containing norbornene as a monomer), a polycarbonate resin, or a polyester resin (such as a poly $C_{2-4}$ alkylene arylate-based copolyester).

The plurality of types of polymers may include at least a cellulose ester (for example, a cellulose $C_{2-4}$ alkyl carboxylate such as cellulose diacetate, cellulose triacetate, cellulose acetate propionate, or cellulose acetate butyrate).

Here, the structure of the upper hard coat layer 4 is fixed by curing of a curable resin precursor contained in the plurality of resin components by an active energy ray (such as ultraviolet light or an electron beam), heat, or the like during the manufacture of the upper hard coat layer 4. In addition, such a curable resin imparts scratch resistance and durability to the upper hard coat layer 4.

From the viewpoint of achieving scratch resistance of the upper hard coat layer 4, at least one polymer included in the plurality of types of polymers is preferably a polymer including a functional group in a side chain, the functional group being capable of reacting with a curable resin precursor. The polymer forming the structure of the upper hard coat layer 4 may include an additional polymer in addition to the two mutually immiscible polymers described above. A mass ratio M1/M2 of a mass M1 of the first polymer to a mass M2 of the second polymer, and a glass transition temperature of the polymers can be set as appropriate.

The curable resin precursor can be exemplified by curable compounds including a functional group, the functional group reacting by an active energy ray (such as ultraviolet light or an electron beam), heat, or the like, the curable compounds curing or crosslinking through this functional group to form a resin.

Such a curable compound can be exemplified by thermosetting compounds or thermosetting resins (low molecular weight compounds including an epoxy group, a polymerizable group, an isocyanate group, an alkoxysilyl group, a silanol group, or the like (e.g., such as an epoxy resin, an unsaturated polyester resin, a urethane resin, and a silicone resin)), and photocurable (ionizing radiation curable) compounds curing by ultraviolet light, an electron beam, or the like (ultraviolet curable compounds, such as photocurable monomers and oligomers). Among these curable compounds, ultraviolet curable compounds, for example, are particularly practical. To improve resistance, such as scratch resistance, the photocurable compound preferably has 2 or more (preferably from 2 to 15 and more preferably from 4 to approximately 10) polymerizable unsaturated bonds per molecule. Specifically, the photocurable compound is preferably epoxy (meth)acrylate, urethane (meth)acrylate, polyester (meth)acrylate, silicone (meth)acrylate, or a multifunctional monomer including at least two polymerizable unsaturated bonds.

The curable resin precursor may contain a curing agent according to the type of the curable resin precursor. For example, the thermosetting resin precursor may contain a curing agent, such as an amine and a polyvalent carboxylic acid, and the photocurable resin precursor may contain a photopolymerization initiator. The photopolymerization initiator can be exemplified by commonly used components, such as, for example, acetophenones or propiophenones, benzyls, benzoins, benzophenones, thioxanthones, and acylphosphine oxides.

In addition, the curable resin precursor may contain a curing accelerator. For example, the photocurable resin precursor may contain a photocuring accelerator, such as, for example, a tertiary amine (such as dialkylaminobenzoate), a phosphine photopolymerization accelerator, or the like.

In the manufacturing process of the upper hard coat layer 4, at least two components of the polymer and the curable resin precursor contained in a solution that serves as a raw material of the upper hard coat layer 4, are used as the combination to be phase-separated from each other at or near the processing temperature. Examples of the combination to be phase-separated include a combination (a) of a plurality of types of polymers mutually immiscible to be phase-separated, a combination (b) of a polymer and a curable resin precursor immiscible to be phase-separated, or a combination (c) of a plurality of curable resin precursors mutually immiscible to be phase-separated. Among these combinations, typically the combination (a) of a plurality of types of polymers and the combination (b) of a polymer and a curable resin precursor are used, and in particular, the combination (a) of a plurality of types of polymers is preferred.

Typically, the refractive index of the polymer and the refractive index of the cured resin or crosslinked resin produced by curing the curable resin precursor mutually differ. Moreover, typically, the refractive indexes of the plurality of types of polymers (the first polymer and the second polymer) also mutually differ. A difference in refractive index between the polymer and the cured resin or crosslinked resin, and a difference in refractive index between the plurality of types of polymers (the first polymer and the second polymer) are, for example, preferably a value within a range from 0 to 0.04, and more preferably a value within a range from 0 to 0.02.

The upper hard coat layer 4 may include the plurality of fine particles (fillers) 30 of the first embodiment dispersed in a matrix resin. Further, the upper hard coat layer 4 may include, in a range in which the optical characteristics are not impaired, a commonly used additive such as, for example, organic or inorganic particles, a stabilizer (such as an antioxidant or an ultraviolet absorber), a surfactant, a water-soluble polymer, a filler, a crosslinker, a coupling agent, a colorant, a flame retardant, a lubricant, a wax, a preservative, a viscosity modifier, a thickener, a leveling agent, or an antifoaming agent.

The method of manufacturing the upper hard coat layer 4 according to the third embodiment includes, as an example, preparing a solution that serves as a raw material of the upper hard coat layer 4 (hereinafter, also simply referred to as a "solution"); coating a surface of a predetermined support (the lower hard coat layer 3 in the present embodiment) with the solution prepared in the preparation, evaporating a solvent in the solution, and forming a phase separation structure by spinodal decomposition from a liquid phase; and curing a curable resin precursor after the formation.

Preparation

In the preparation, a solution is prepared that contains a solvent and a resin composition for forming the upper hard coat layer 4. The solvent can be selected according to the type and solubility of the polymer and curable resin precursor contained in the above-described upper hard coat layer 4. The solvent is preferably a solvent that can uniformly dissolve at least solid content (the plurality of types of polymers and the curable resin precursor, a reaction initiator, and other additives).

The solvent can be exemplified by ketones (such as acetone, methyl ethyl ketone, methyl isobutyl ketone, and cyclohexanone), ethers (such as dioxane and tetrahydrofuran), aliphatic hydrocarbons (such as hexane), alicyclic hydrocarbons (such as cyclohexane), aromatic hydrocarbons (such as toluene and xylene), halogenated carbons (such as dichloromethane and dichloroethane), esters (such as methyl acetate, ethyl acetate, and butyl acetate), water, alcohols (such as ethanol, isopropanol, butanol, and cyclohexanol), cellosolves (such as methyl cellosolve and ethyl cellosolve), cellosolve acetates, sulfoxides (such as dimethyl sulfoxide), and amides (such as dimethylformamide and dimethylacetamide). In addition, the solvent may be a mixed solvent.

A composition containing the thermoplastic resin, a photocurable compound, a photopolymerization initiator, the thermoplastic resin, and a photocurable compound is preferable as the resin composition. Alternatively, a composition containing the plurality of types of mutually immiscible polymers, a photocurable compound, and a photopolymerization initiator is preferable as the resin composition. The concentration of a solute (polymer and curable resin precursor, reaction initiator, and other additives) in the solution can be adjusted in a range in which phase separation of the plurality of resin components occurs, and in which the flow extensibility, coating properties and such of the solution are not impaired.

Here, a value (sparkle value) of the standard deviation of the luminance distribution of the display 16a with the antiglare film 1 attached thereon may vary depending on a combination of the resin compositions in the solution or the mass ratio, the execution conditions of the preparation, the formation, and the curing, or the like. Therefore, an antiglare film having targeted physical properties can be obtained by forming the upper hard coat layers 4 while changing the conditions, and measuring and ascertaining in advance the physical properties of the obtained upper hard coat layers 4.

Formation

In the formation, the solution prepared in the preparation is cast or applied onto the surface of the support (here, as an example, the substrate 2). Examples of a method for casting or a method for coating with the solution include commonly used methods using, for instance, spraying, a spinner, a roll coater, an air knife coater, a blade coater, a rod coater, a reverse coater, a bar coater, a comma coater, dipping, a dip squeeze coater, a die coater, a gravure coater, a micro gravure coater, and a silk screen coater.

The solvent is evaporated and removed by drying from the solution that was cast or coated onto the surface of the support. Phase separation through spinodal decomposition from the liquid phase of the plurality of resin components occurs in association with concentration of the solution in this evaporation process, and a phase separation structure with a relatively regular interphase distance (pitch or mesh diameter) is formed. The co-continuous phase structure of the long and narrow protrusions can be formed by setting drying conditions or a formulation, and thus the melt flowability of the resin component after solvent evaporation is relatively high.

From the perspective of ease of formation of the long and narrow protrusions at the surface of the upper hard coat layer 4, the solvent is preferably evaporated by heating and drying. Note that in a case where the drying temperature is too low or the drying time is too short, an amount of heat that is imparted to the resin component will be insufficient, and the melt flowability of the resin component may be reduced, which may make it difficult to form long and narrow protrusions.

On the other hand, in a case in which the drying temperature is too high or the drying time is too long, once formed, the long and narrow protrusions may flow, leading to a decrease in height, but the structure of the long and narrow protrusions is maintained. Therefore, the drying temperature and drying time can be utilized as methods for changing the height of the long and narrow protrusions to adjust the antiglare properties and slipperiness of the upper hard coat layer 4. Furthermore, in the formation, a co-continuous phase structure, in which the phase separation structure is connected, can be formed by raising the evaporation temperature of the solvent or using a component having a low viscosity for the resin component.

When the co-continuous phase structure is formed and roughening occurs in association with the progression of phase separation due to spinodal decomposition from the liquid phase of the plurality of resin components, the continuous phase becomes discontinuous, and a droplet phase structure (island structure of an independent phase having a shape such as spherical, perfectly spherical, disc-like, or ellipsoidal) is formed. Here, depending on the degree of phase separation, an intermediate structure between the co-continuous phase structure and the droplet phase structure (that is, a phase structure in a process of transitioning from the co-continuous phase to the droplet phase) can also be formed. After the solvent has been removed, the upper hard coat layer 4 with fine recesses and protrusions at the surface is formed.

Thus, with the shapes of fine recesses and protrusions formed on the surface of the upper hard coat layer 4 by phase separation, the haze value of the upper hard coat layer 4 can be adjusted even without dispersing fine particles in the upper hard coat layer 4. Moreover, because fine particles need not be dispersed in the upper hard coat layer 4, the haze value of the upper hard coat layer 4 can be more easily adjusted while suppressing an internal haze value as compared to an external haze value. Note that the upper hard coat layer 4 containing fine particles can be formed by adding fine particles to the solution in the preparation.

Curing

In the curing, the curable resin precursor in the solution is cured, whereby the phase separation structure formed in the formation is fixed and the upper hard coat layer 4 is formed. Curing of the curable resin precursor is performed by heating or irradiation with an active energy ray, or by a combination of these methods, depending on the type of curable resin precursor. The active energy ray to be irradiated is selected according to the type of photocurable components or the like.

The irradiation with an active energy ray may be performed in an inert gas atmosphere. When the active energy ray is ultraviolet light, examples of light sources that can be used include a far-ultraviolet light lamp, a low-pressure mercury lamp, a high-pressure mercury lamp, an ultrahigh-pressure mercury lamp, a halogen lamp, and a laser light source (light source such as a helium-cadmium laser and an excimer laser).

With the processes described above, an antiglare film including the upper hard coat layer 4 of the third embodiment is manufactured. In the present embodiment, by forming the co-continuous phase structure and thus setting the thickness of the upper hard coat layer 4 after completion to a value within the range from 3 μm to 6 μm, for example, the shapes of recesses and protrusions suitable for suppressing sparkle can be imparted to the surface of the upper hard coat layer 4. Here, as a method of suppressing the sparkle of the display 16a when the antiglare film is attached, it is conceivable, for example, to reduce the size of the recesses and protrusions at the surface of the upper hard coat layer 4, but a decrease in antiglare properties of the antiglare film needs to be considered. However, in addition to reduction in size of the recesses and protrusions at the upper hard coat layer 4, the inclination of the recesses and protrusions at the upper hard coat layer 4 is increased to make the recesses and protrusions steep, and the number of recesses and protrusions is increased. Consequently, it is possible to improve the antiglare properties while suppressing sparkle on the display 16a when the antiglare film is attached.

Sparkle Measurement Apparatus and Sparkle Measurement Method

Next, a sparkle measurement apparatus and a sparkle evaluation method will be described.

Sparkle Measurement Apparatus

Figure 4:
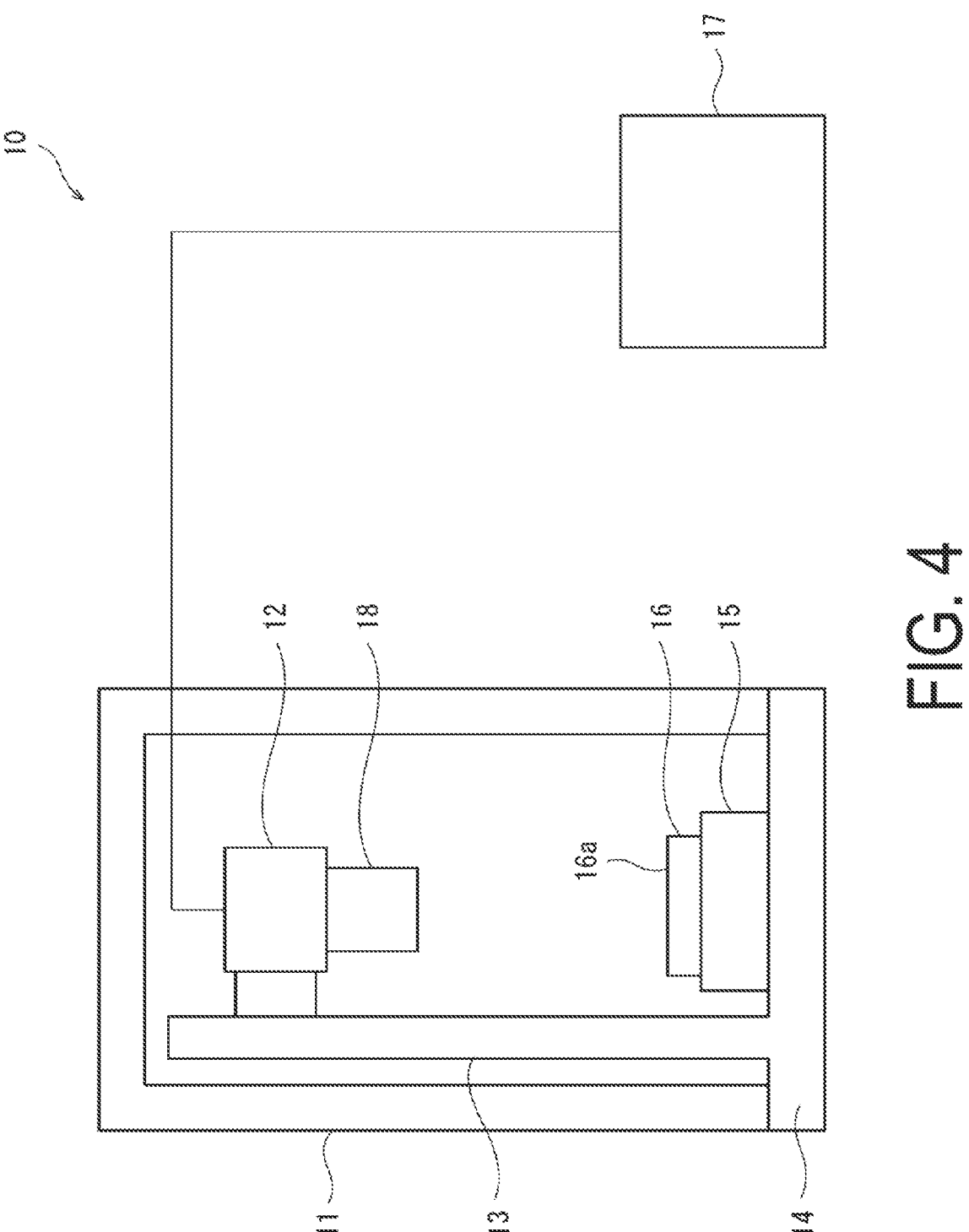
FIG. 4 is a schematic outline view of a sparkle measurement apparatus.

FIG. 4 is a schematic outline view of the sparkle measurement apparatus 10. The sparkle measurement apparatus 10 is an apparatus that measures the extent of sparkle on the display 16a on which the antiglare film 1 is attached. The sparkle measurement apparatus 10 includes an enclosure 11, an imaging device 12, a holding portion (adjusting portion) 13, an imaging device stand 14, a display device stand (adjusting portion) 15, and an image processing device 17.

The enclosure 11 forms a dark room that serves as a sparkle measurement space. The enclosure 11 has a hollow rectangular parallelepiped shape. In the enclosure 11, the imaging device 12, the holding portion 13, the imaging device stand 14, and the display device stand 15 are disposed. In addition, in the enclosure 11, the display device 16 to be subjected to sparkle measurement is disposed. Note that the enclosure 11 has a configuration capable of preventing light from entering the enclosure 11 from the outside at the time of imaging by the imaging device 12.

The imaging device 12 is, as an example, an area camera including a lens 18 and an imaging element. The imaging device 12 captures an image to be displayed on the display 16a. The imaging device 12 is held by the holding portion 13, and thus the lens 18 faces the display 16a. The imaging device 12 is connected to the image processing device 17. Image data captured by the imaging device 12 is transmitted to the image processing device 17.

The holding portion 13 is a layer having a bar shape extending in a vertical direction (up-down direction on the paper surface in FIG. 4). A proximal end side of the holding portion 13 is fixed by the imaging device stand 14. The imaging device 12 is held at a distal end side of the holding portion 13. The imaging device 12 is disposed movably in the vertical direction by the holding portion 13. Moving the imaging device 12 in the vertical direction changes a relative distance between the display 16a and the lens 18.

The display device 16 is placed on an upper surface of the display device stand 15 in a state in which the display 16a with the antiglare film attached thereon faces the imaging device 12. The display device stand 15 supports the display device 16 with the surface of the display 16a, on which the antiglare film is attached, facing the imaging device 12 and serving as a horizontal surface. Further, the display device stand 15 moves the display device 16 in the vertical direction, and thus the relative distance between the display 16a and the lens 18 is changed.

With the sparkle measurement apparatus 10, a size of an image displayed on the display 16a as captured by the imaging element is adjusted by adjusting a relative distance between the imaging device 12 and the display 16a. In other words, a pixel size of the image displayed on the display 16a as captured per unit pixel (for example, one pixel) of a plurality of light-receiving elements of the imaging element is adjusted.

The image processing device 17 processes the image data captured by the imaging device 12. Specifically, the image processing device 17 obtains, from the image data captured by the imaging device 12, a value of a standard deviation of the luminance distribution of the image displayed on the display 16a. The image processing device 17 includes, as an example, an input unit to which the image data captured by the imaging device 12 is input, an image processing unit that subjects the input image data to image processing, and an output unit that outputs a result obtained by processing of the image processing unit to a display instrument, a printing device, or the like (not illustrated).

Note that, as the method of adjusting a pixel size of the image displayed on the display 16a as captured per unit pixel (for example, one pixel) of the imaging element, a method of varying a focal length of the imaging device 12 may be adopted when the lens 18 included in the imaging device 12 is a zoom lens, in addition to the method of varying the relative distance (imaging distance) between the lens 18 of the imaging device 12 and the display 16*a*.

The F value of the lens 18 and the shutter speed (exposure time) of the imaging device 12 can be set as appropriate. The F value of the lens 18 is preferably, for example, an F value within a range from F4 to F8 (as one example, any one of F4, F6, or F8) from the viewpoint of reducing periodic noise, included in image data, caused by the structure of the display 16*a* (for example, a pixel or a pixel array) during imaging. Of these, F8 is most preferable for the F value of the lens 18, for example. Further, the shutter speed of the imaging device 12 is preferably a value within a range in which a light amount appropriate for measuring the sparkle is obtained (for example, a range from 0.01 sec to 0.1 sec).

The imaging conditions can be set to, for example, the following contents.

F value of the lens 18: F8

Lens focal distance: 12 mm

Range of Y/X: a value within a range from 1.65 to 1.75

Note that X is the pixel size (μm) of the display. Y is an imaging pitch (μm) of the pixels of the imaging element of the imaging device 12. In a case in which a display achieves color display using the three primary colors of red (R), green (G), and blue (B), the term "pixel" as used herein refers to a group of three pixels of RGB serving as a unit for color display. Further, the imaging pitch refers to an average value $\{(A1+A1)/2\}$ of a value A1 $(A1=L1/N1)$ calculated by dividing a vertical direction length L1 of an image captured by an imaging element of the imaging device 12 by the number N1 of pixels in the vertical direction of the imaging element of the imaging device 12, and a value A2 $(A2=L2/N2)$ calculated by dividing a horizontal direction length L2 of the image captured by the imaging element of the imaging device 12 by the number N2 of pixels in the horizontal direction of the imaging element of the imaging device 12.

Sparkle Measurement Method

In the sparkle evaluation method indicated below, for convenience of evaluation, as an example, display is performed by causing the display 16*a* to emit one-color light evenly (green as one example) in advance with the antiglare film attached to the surface thereof.

First, adjustment is performed, and thus a pixel size of the display 16*a*, with the antiglare film attached thereon, as captured per unit pixel of the imaging element is set to a predetermined value (adjustment). At the time of adjustment, a relative distance between the imaging device 12 and the display 16*a* with the antiglare film attached thereon is adjusted in accordance with the number of effective pixels of the imaging element, and thus in the image data captured by the imaging device 12, emission lines of the pixels of the image displayed on the display 16*a* with the antiglare film attached thereon are invisible or, even if visible, visible to an extent to which sparkle evaluation is not affected.

Note that, a relative distance between the imaging device 12 and the display device 16 is preferably set in consideration of an actual usage mode of the display device 16 (for example, a relative distance between the eyes of a user and the display 16*a*).

After the adjustment, a measurement area for evaluating sparkle on the display 16*a* with the antiglare film attached thereon is set (setting). At the time of setting, the measurement area can be set as appropriate in accordance with, for example, a size of the display 16*a*.

After the adjustment, an image of the measurement area of the display 16*a* with the antiglare film attached thereon is captured by the imaging device 12 (imaging). In this case, as one example, at least one of a shutter speed of the imaging device 12 or luminance of all the pixels of the display 16*a* is adjusted, and thus image data of a gray scale image in 8-bit gradation display with an average luminance of 170 tones is obtained. The image data captured at the time of the imaging is input to the image processing device 17.

After the imaging, the image processing device 17 obtains, from the image data, a variation in luminance of the image in the measurement area of the display 16*a* with the antiglare film attached thereon (calculation). At the time of the calculation, the variation in luminance can be expressed in a numerical form by obtaining a standard deviation of luminance distribution. Here, the greater the variation in luminance of the display 16*a* with the antiglare film attached thereon, the greater the degree of sparkle of the display 16*a* with the antiglare film 1 attached thereon. On the basis of this, it can be quantitatively and objectively evaluated that the less the value of a standard deviation of luminance distribution, the less the sparkle. Further, at the time of the adjustment, the emission lines of the display 16*a* with the antiglare film attached thereon are adjusted to an extent to which sparkle evaluation is not affected. Thus, luminance unevenness due to the emission lines is suppressed, and accurate sparkle evaluation can be performed.

With the processes described above, a standard deviation of luminance distribution of the display 16*a* with the antiglare film attached on a surface thereof can be obtained, and sparkle can be evaluated of the basis of a magnitude of the value.

Confirmation Test

Next, confirmation tests to confirm the performance of the present disclosure will be described. The present disclosure is not limited to the Examples 1 to 8 described below. Examples 1 to 4 and 8 correspond to the first embodiment. Example corresponds to the second embodiment. Examples 6 and 7 correspond to the third embodiment. Further, Comparative Examples 1 and 2 were prepared for comparison with Examples 1 to 8. The following materials (A) to (M) were prepared as materials of the antiglare films according to these Examples and Comparative Examples.

Raw Materials (A) Nanosilica-containing urethane-based ultraviolet curable compound: "HX-RPH-NA" available from Kyoeisha Chemical Co., Ltd., containing nanosilica fine particles (average particle size: 15 nm)

(B) Fluorine group-containing ultraviolet reactive surface modifier: "MEGAFACE RS-75" available from DIC Corporation (C) Acrylic hard coat formulation A; "FA-3155 Clear" available from Nippon Kako Toryo Co., Ltd., refractive index of 1.46

(D) Acrylic hard coat formulation B: "FA-3155M" available from Nippon Kako Toryo Co., Ltd., containing acrylic fine particles (refractive index of 1.50) and a matrix resin (refractive index of 1.46)

(E) Acrylic polymer A including a polymerizable group: "Cyclomer P" available from Daicel-Allnex Ltd., refractive index of 1.51

(F) Cellulose acetate propionate: "CAP-482-20" available from Eastman Chemical Company, degree of acetylation=2.5%, degree of propionylation=46%, number average molecular weight of 75000 in terms of polystyrene, refractive index of 1.49

(G) Silicone acrylate: "EB1360" available from Daicel-Allnex Ltd., a refractive index of 1.52

(H) Dipentaerythritol hexaacrylate: "DPHA" available from Daicel-Allnex Ltd., a refractive index of 1.52

(I) Pentaerythritol triacrylate: "PETA" available from Daicel-Allnex Ltd., refractive index of 1.51

(J) Urethane acrylate A: "KRM8452" available from Daicel-Allnex Ltd., a 10-functional aliphatic urethane acrylate, average molecular weight of 1200

(K) Photoinitiator A: "Irgacure 184" available from BASF Japan Ltd.

(L) Polymer-type leveling agent: "BYK-399" available from BYK Japan (M) PET film. "DIAFOIL" available from Mitsubishi Chemical Corporation, thickness of 125 μm

Example 1

A solution was prepared by mixing 100 parts by weight of the nanosilica-containing urethane-based ultraviolet curable compound (A) and 0.5 parts by weight of the polymer-type leveling agent (L). This solution was cast onto a PET film (M) that is the substrate 2 using a wire bar (#18). Subsequently, the solution was left in an oven at 100° C. for 1 minute to evaporate the solvent, and a coat layer having a thickness of approximately 10 μm was formed. Then, the coat layer was irradiated with ultraviolet light using a high-pressure mercury lamp for approximately 5 seconds (irradiation by integrated light amount of about 300 mi/cm², the same applies hereinafter), whereby the coat layer was ultraviolet light cured. Thus, the lower hard coat layer 3 having a thickness of 10 μm was formed.

Next, a solution was prepared by mixing 50 parts by weight of the acrylic hard coat formulation A (C) and 50 parts by weight of the acrylic hard coat formulation B (D). This solution was cast onto the lower hard coat layer 3 using a wire bar (#10). Subsequently, the solution was left in an oven at 100° C. for 1 minute to evaporate the solvent, and a coat layer having a thickness of approximately 6 μm was formed. Then, the coat layer was irradiated for approximately 5 seconds with ultraviolet light using a high-pressure mercury lamp, whereby the coat layer was UV cured. Thus, the upper hard coat layer 4 having a thickness of 6 μm was formed. As a result, the antiglare film 1 of Example 1 was constructed.

Example 2

The antiglare film 1 of Example 2 was constructed under the same manufacturing conditions as in Example 1 except that the lower hard coat layer 3 having a thickness of 15 μm was formed using a wire bar (#28).

Example 3

The antiglare film 1 of Example 3 was constructed under the same manufacturing conditions as in Example 1 except that the upper hard coat layer 4 having a thickness of 3.5 μm was formed using a wire bar (#6).

Example 4

The antiglare film 1 of Example 4 was constructed under the same manufacturing conditions as in Example 2 except that the upper hard coat layer 4 having a thickness of 3.5 μm was formed using a wire bar (#6).

Example 5

The antiglare film 101 of Example 5 was constructed in the same manner as in Example 3 except that a plurality of antireflection layers were formed on the upper hard coat layer 4. Specifically, a silicon dioxide layer (thickness of 15 nm), a niobium pentoxide layer (thickness of 10 nm), a silicon dioxide layer (thickness of 35 nm), a niobium pentoxide layer (thickness of 100 nm), and a silicon dioxide layer (thickness of 80 nm) were sequentially formed, as the plurality of antireflection layers, on the upper hard coat layer 4 by a sputtering method, which is one of dry coating methods. Subsequently, a fluorine-containing compound solution ("OPTOOL DSX" available from Daikin Industries, Ltd.) was applied to the surface of the antireflection layer located at the uppermost position. Then, the coating of this solution was dried at 100° C. to form an antifouling layer having a thickness of 8 nm. Thus, the antiglare film 101 of Example 5 was constructed.

Example 6

An antiglare film of Example 6 was constructed under the same manufacturing conditions as in Example 1 except that the upper hard coat layer 4 described below was formed. A solution was prepared by dissolving 41 parts by weight of the acrylic polymer A (E) including a polymerizable group, 12 parts by weight of the cellulose acetate propionate (F), 40 parts by weight of the dipentaerythritol hexaacrylate (H), 27.7 parts by weight of the silicone acrylate (G), and 5 parts by weight of the photoinitiator A (K) in a mixed solvent of 250 parts by weight of methyl ethyl ketone and 122 parts by weight of 1-butanol.

This solution was cast onto the lower hard coat layer 3 using a wire bar (#22). Subsequently, the solution was left in an oven at 100° C. for 1 minute to evaporate the solvent, and a coat layer having a thickness of approximately 5 μm was formed. Then, the coat layer was irradiated for approximately 5 seconds with ultraviolet light using a high-pressure mercury lamp, whereby the coat layer was UV cured. Thus, the upper hard coat layer 4 having a thickness of 5 μm was formed. Thus, the antiglare film of Example 6 was constructed.

Example 7

An antiglare film of Example 7 was constructed under the same manufacturing conditions as in Example 1 except that the upper hard coat layer was formed as described below. Specifically, a solution was prepared by dissolving 58 parts by mass of the acrylic polymer A (E) including a polymerizable group, 7 parts by mass of the cellulose acetate propionate (F), 106 parts by mass of the urethane acrylate A (J), 1 part by mass of the fluorine group-containing ultraviolet reactive surface modifier (B), and 3 parts by mass of the photoinitiator A (K) in a mixed solvent of 186 parts by mass of methyl ethyl ketone (MEK), 80 parts by mass of butyl acetate, and 39 parts by mass of 1-butanol.

This solution was cast onto the lower hard coat layer using a wire bar (#18). Subsequently, the solution was left in an oven at 100° C. for 1 minute to evaporate the solvent, and a coat layer having a thickness of approximately 6 μm was formed. Then, the coat layer was irradiated for approximately 5 seconds with ultraviolet light using a high-pressure mercury lamp, whereby the coat layer was UV cured. As a result, an upper hard coat layer having a thickness of 6 μm was formed. Thus, the antiglare film of Example 7 was constructed.

Example 8

An antiglare film of Example 8 was constructed under the same manufacturing conditions as in Example 1 except that the upper hard coat layer was formed as described below. Specifically, the pentaerythritol triacrylate (I), which is a transparent resin, was used. Then, with respect to 100 parts by mass of the transparent resin, 10.0 parts by mass of styrene-acrylic copolymer particles (a refractive index of 1.51, an average particle size of 9.0 μm) and 16.5 parts by mass of polystyrene particles (a refractive index of 1.60, an average particle size of 3.5 μm), both particles being transparent particles, were included. Then, a solution was prepared by adding 190 parts by mass of a mixed solvent of toluene and cyclohexanone in a mass ratio of 7:3 to 100 parts by mass of the transparent resin.

This solution was cast onto the lower hard coat layer using a wire bar (#16). Subsequently, the solution was left in an oven at 100° C. for 1 minute to evaporate the solvent, and a coat layer having a thickness of approximately 5 μm was formed. Then, the coat layer was irradiated for approximately 5 seconds with ultraviolet light using a high-pressure mercury lamp, whereby the coat layer was UV cured. Thus, an upper hard coat layer having a thickness of 5 μm was formed. Thus, the antiglare film of Example 8 was constructed.

Comparative Example 1

An antiglare film of Comparative Example 1 was constructed under the same manufacturing conditions as in Example 1 except that a lower hard coat layer having a thickness of 5 μm was formed using a wire bar (#8). As a result, the film of Comparative Example 1 was constructed.

Comparative Example 2

An antiglare film of Comparative Example 2 was constructed under the same manufacturing conditions as in Comparative Example 1 except that an upper hard coat layer having a thickness of 3.5 μm was formed using a wire bar (#6). Next, each item below was measured and the measurement result was evaluated for each antiglare film of Examples 1 to 8 and Comparative Examples 1 and 2.
Pencil Hardness The pencil hardness was measured by a method compliant with scratch hardness (pencil method) in accordance with JIS K 5600-5-4:1999. Specifically, using a pencil hardness tester (No. 553-M pencil hardness tester available from Yasuda Seiki Seisakusho. Ltd.) and with the antiglare film placed on a glass substrate, the measurement was performed on the basis of an angle of the pencil with respect to the antiglare film of 45°, a load of 750 g, and a measurement speed of 30 mm/min as the measurement conditions. In the measurement, a pencil "Hi-uni" available from Mitsubishi Pencil Co., Ltd. was used, and three scratching operations were performed per measurement.
Curl Height The antiglare film was cut to a constant planar size (100 mm×100 mm), and placed on a flat reference surface for a certain period of time with the upper hard coat layer facing upward of the substrate. At this time, a maximum height from the reference surface (maximum height among the four corners) of the antiglare film lifted from the reference surface was measured to evaluate the curl height. According to the evaluation, the evaluation can conclude that the less the value of the maximum height of the curl, the flatter the antiglare film and thus the easier it is to attach the antiglare film on the display 16a.
Standard Deviation (Sparkle Value) of Luminance Distribution of Display A smartphone was used as the display device 16, and the antiglare film was attached on the surface of the display 16a. The display 16a of this smartphone is a self-luminous color display, and is an organic EL (OLED) having a pixel density of 441 ppi. Further, the pixel array of this display 16a is a PenTile array. Specifically, the PenTile array includes two red sub-pixels, two green sub-pixels, and one blue sub-pixel per pixel. This smartphone is "Galaxy S4 (SC-04E)" available from Samsung Electronics Co., Ltd.

Further, the standard deviation (sparkle σ: sparkle value) of the luminance distribution of the display 16a of the display device 16 when the antiglare film is attached thereon was measured using a sparkle measurement apparatus available from Komatsu NTC Ltd. as the sparkle measurement apparatus 10. When this measurement was performed, at least one of the shutter speed of the imaging device 12 or the luminance of all the pixels of the display device 16 was adjusted, and thus image data as a gray scale image in 8-bit gradation display with an average luminance of 170 gradations was obtained. Thus, the standard deviation of the luminance distribution of the display measured by a method compliant with JIS C 1006:2019 was measured.

The measurement conditions at this time were as follows.

The imaging conditions can be set to, for example, the following contents.

F value of the lens 18: F8

Lens focal distance: 12 mm

Y: 97.2 μm

X: 57.6 μm

Y/X: 1.69

Relative distance between the lens 18 and the display 16a (imaging distance): 328 mm
Haze and Total Light Transmittance Haze was measured by a method compliant with JIS K 7136 using a haze meter (NDH-5000W available from Nippon Denshoku Industries Co., Ltd.). The haze was measured with the surface of the upper hard coat layer opposite to the surface including the shapes of recesses and protrusions being disposed on a light receiver side.
Luminous Reflectance A spectrophotometer ("U-3900H" available from Hitachi High-Tech Science Corporation) was used on the basis of a method compliant with JIS Z 8701 to perform measurement. The antiglare films of Examples 1 to 8 and Comparative Examples 1 and 2 to be measured were attached to a commercially available black acrylic sheet by an optical glue to minimize the influence of reflections from the back surface as much as possible.
60° Gloss The gloss at an angle of incidence of 60 degrees on the surface of the antiglare film (hereinafter also referred to as 60° gloss) was measured on the basis of a method compliant with JIS K7105 using a gloss meter (IG-320 available from Horiba, Ltd.).

In addition, a ratio D2/D1(%) of a thickness D2 of the lower hard coat layer to a thickness D1 of the upper hard coat layer in Examples to 8 and Comparative Examples 1 to 4 was calculated. The measurement results and the calculation results are shown in 5 Table 6 and Table 2.

TABLE 1

| | Pencil hardness (load of 750 g) | Curl height (mm) | Standard deviation of luminance distribution | Haze (%) | Total light transmittance (%) | Luminous reflectance (%) | 60° gloss (%) | D2/D1 (%) |
|---|---|---|---|---|---|---|---|---|
| Example 1 | 4H | 13 | 7.5 | 12 | 90 | 4.4 | 54 | 166.7 |
| Example 2 | 4H | 15 | 7.5 | 12 | 90 | 4.4 | 54 | 250 |
| Example 3 | 4H | 4 | 7.1 | 15 | 90 | 4.4 | 51 | 285.7 |
| Example 4 | 5H | 6 | 7.1 | 15 | 90 | 4.4 | 51 | 428.6 |
| Example 5 | 4H | 4 | 7.1 | 16 | 93 | 0.6 | 51 | 285.7 |
| Example 6 | 4H | 10 | 6.9 | 17 | 90 | 4.5 | 55 | 200 |
| Example 7 | 4H | 13 | 14.5 | 10 | 89 | 4.5 | 54 | 166.7 |
| Example 8 | 4H | 11 | 10.9 | 31 | 90 | 4.5 | 50 | 200 |

TABLE 2

| | Pencil hardness (load of 750 g) | Curl height (mm) | Standard deviation of luminance distribution | Haze (%) | Total light transmittance (%) | Luminous reflectance (%) | 60° gloss (%) | D2/D1 (%) |
|---|---|---|---|---|---|---|---|---|
| Comparative Example 1 | 2H | 8 | 7.5 | 12 | 91 | 4.4 | 54 | 83.3 |
| Comparative Example 2 | 2H | 4 | 7.1 | 15 | 91 | 4.4 | 51 | 142.9 |

As shown in Table 1, in the configurations of the present disclosure illustrated in Examples 1 to 8, the ratio D2/D1 was a value within a range from 166.7% to 428.6%. Among them, in the configuration of the present disclosure illustrated in Examples 2 to 6 and 8, the ratio D2-D1 was a value within a range from 200% to 428.6%.

Further, in the configurations of the present disclosure illustrated in Examples 1 to 6 and 8, the sparkle value, which is the standard deviation of the luminance distribution, was a value within a range from 0 to 12 (specifically, from 6.9 to 10.9). In the configurations of the present disclosure illustrated in Examples 1 to 7, the haze was a value within a range from 0.5% to 25% (specifically, from 10% to 17%). In the configurations of the present disclosure illustrated in Examples 1 to 8, the 60° gloss was a value within a range from 50% to 55%. In the configurations of the present disclosure illustrated in Examples 1 to 8, the total light transmittance was a value within a range from 85% to 100% (specifically, from 89% to 93%).

Further, in the configurations of the present disclosure illustrated in Examples 1 to 8, the curl height was a value within a range of 15 mm or less. In the configurations of the present disclosure illustrated in Examples 1 to 8, the pencil hardness of the surface of the upper hard coat layer 4 on the side opposite to the lower hard coat layer 3 was a value within a range of 4H or greater. In Example 5, the luminous reflectance was a value within a range of 1.0% or less (specifically 0.6%). As a result, it was confirmed that in Example 5, with the antiglare film attached on the surface of the display, reflection of incident light on the display was suppressed and thus the display contents on the display was easily viewed. On the other hand, it was confirmed that in Comparative Examples 1 and 2, the pencil hardness was 2H and thus the hardness was inferior to those of Examples 1 to 8. From the above, superiority of Examples 1 to 8 over Comparative Examples 1 and 2 was confirmed.

Note that each of the configurations, each of the methods, combinations thereof, and the like in each of the embodiments are examples, and additions, omissions, replacements, and other changes to the configurations may be made as appropriate without departing from the spirit of the present disclosure. The present disclosure is not limited by the embodiment and is limited only by the claims. Each aspect disclosed in the present specification can be combined with any other feature disclosed herein.

REFERENCE SIGNS LIST 1, 101 Antiglare film
2 Substrate
3 Lower hard coat layer
4 Upper hard coat layer
5 Lower antireflection layer (antireflection layer)
6 Upper antireflection layer (antireflection layer)
16a Display
30 Lower matrix resin
31 Fine particle
40 Upper matrix resin
41 Recess and protrusion forming particle

The invention claimed is:
1. An antiglare film comprising:
a substrate having a sheet-like shape;
a lower hard coat layer disposed overlapping the substrate; and
an upper hard coat layer disposed and layered on a side of the lower hard coat layer opposite to a side of the substrate;
wherein a thickness of the lower hard coat layer is a value within a range of at least 150% or more of a thickness of the upper hard coat layer; and
wherein in a state in which the antiglare film is attached on a surface of an organic electroluminescent (EL) display having a pixel density of 441 ppi, a standard deviation of luminance distribution of the display as measured by a method compliant with JIS C 1006:2019 is a value within a range from 0 to 12 when the display is adjusted to obtain image data as a gray scale image in 8-bit gradation display with an average luminance of 170 tones.
2. The antiglare film according to claim 1, wherein a haze value is a value within a range from 0.5% to 25%.
3. The antiglare film according to claim 1, wherein a pencil hardness of a surface of the upper hard coat layer on a side opposite to the lower hard coat layer is a value within a range of 4H or greater.

4. The antiglare film according to claim 1, wherein a thickness of the upper hard coat layer is a value within a range from 3 μm to 6 μm.

5. The antiglare film according to claim 1, wherein a thickness of the lower hard coat layer is a value within a range from 10 μm to 20 μm.

6. The antiglare film according to claim 1, wherein the upper hard coat layer includes an upper matrix resin and particles forming recesses and protrusions dispersed in the upper matrix resin and having an average particle size within a range from 0.5 μm to 5.0 μm.

7. The antiglare film according to claim 6, wherein a difference in refractive index between the upper matrix resin and the particles forming recesses and protrusions is a value within a range from 0 to 0.20.

8. The antiglare film according to claim 1, wherein the upper hard coat layer includes a plurality of resin components, and has a co-continuous phase structure formed by phase separation of the plurality of resin components.

9. The antiglare film according to claim 1, wherein the lower hard coat layer includes a lower matrix resin and fine particles dispersed in the lower matrix resin and having an average particle size within a range from 5 nm to 100 nm.

10. The antiglare film according to claim 1, comprising at least one antireflection layer disposed and layered on a side of the upper hard coat layer opposite to the lower hard coat layer.

11. The antiglare film according to claim 10, wherein the at least one antireflection layer disposed in contact with the upper hard coat layer includes metal oxide particles.

* * * * *